(12) United States Patent
Park

(10) Patent No.: US 11,736,827 B2
(45) Date of Patent: Aug. 22, 2023

(54) IMAGE SENSING DEVICE

(71) Applicant: SK hynix Inc., Icheon-si (KR)

(72) Inventor: Soon Yeol Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/524,177

(22) Filed: Nov. 11, 2021

(65) Prior Publication Data
US 2022/0182566 A1   Jun. 9, 2022

(30) Foreign Application Priority Data

Dec. 7, 2020   (KR) .................. 10-2020-0169530

(51) Int. Cl.
*H04N 25/617* (2023.01)
*H01L 27/146* (2006.01)
*H04N 25/79* (2023.01)
*H04N 25/75* (2023.01)

(52) U.S. Cl.
CPC ..... *H04N 25/617* (2023.01); *H01L 27/14634* (2013.01); *H04N 25/79* (2023.01); *H04N 25/75* (2023.01)

(58) Field of Classification Search
CPC ...... H04N 25/617; H04N 25/70; H04N 25/75; H04N 25/79; H01L 25/162; H01L 27/14609; H01L 27/14634; H01L 2225/06537
See application file for complete search history.

(56) References Cited

U.S. PATENT DOCUMENTS

2012/0061789 A1   3/2012   Yang et al.
2012/0062777 A1*  3/2012   Kobayashi .......... H01L 27/1462
                                              348/E5.091

FOREIGN PATENT DOCUMENTS

KR   20110136627 A   12/2011
WO    2020054414 A1    3/2020

* cited by examiner

*Primary Examiner* — Lin Ye
*Assistant Examiner* — Chriss S Yoder, III
(74) *Attorney, Agent, or Firm* — Perkins Coie LLP

(57) ABSTRACT

An image sensing device includes a first substrate structured to support a pixel array that includes a plurality of unit pixels arranged in a first direction and a second direction and configured to detect incident light to produce pixel signals carrying image information in the incident light; a second substrate structured to support one or more circuits for operation of the image sensing device including receiving a pixel signal from the plurality of unit pixels; and a shielding layer disposed between the first substrate and the second substrate, wherein the shielding layer includes shielding driver circuitry and conductive lines coupled to the shielding driver circuitry to receive electrical currents which produce electromagnetic fields to offset electromagnetic fields induced by currents in the one or more circuits supported by the second substrate.

18 Claims, 7 Drawing Sheets

IMAGE SENSING DEVICE

CROSS-REFERENCE TO RELATED APPLICATION

This patent document claims the priority and benefits of Korean patent application No. 10-2020-0169530, filed on Dec. 7, 2020, the disclosure of which is incorporated by reference in its entirety as part of the disclosure of this patent document.

TECHNICAL FIELD

The technology and implementations disclosed in this patent document generally relate to an image sensing device including a shielding device.

BACKGROUND

An image sensing device is a semiconductor device for capturing and converting light of optical images into electrical signals for displaying the captured images and for further processing of the captured images. The recent development of various industries and sectors, including computer and communication industries generates various demands for high-performance image sensors in various electronic devices such as smartphones, digital cameras, game consoles, Internet of Things (IoT), robots, surveillance cameras, and medical micro-cameras.

Image sensing devices may be broadly classified into CCD (Charge Coupled Device)-based image sensing devices and CMOS (Complementary Metal Oxide Semiconductor)-based image sensing devices. CCD image sensing devices offer a high image quality and better noise characteristics than CMOS image sensing devices. However, CMOS image sensing devices are now widely used due to certain advantages over CCD image sensor, including, e.g., higher frame rates, shutter speed and various scanning schemes. In addition, CMOS image sensing devices and signal processing circuitry can be integrated into a single chip, making it possible to miniaturize electronic devices while achieving low power consumption and reduction in production costs. Such characteristics make CMOS image sensing devices better suited for implementations in mobile devices.

SUMMARY

Various embodiments of the disclosed technology relate to an image sensing device structured to offset an electromagnetic field induced in a substrate, thereby improving noise robustness.

In one aspect, an image sensing device is provided to include a first substrate structured to support a pixel array that includes a plurality of unit pixels arranged in a first direction and a second direction and configured to detect incident light to produce pixel signals carrying image information in the incident light, a second substrate structured to support one or more circuits for operation of the image sensing device including receiving a pixel signal from the plurality of unit pixels and a shielding layer disposed between the first substrate and the second substrate, wherein the shielding layer includes shielding driver circuitry and conductive lines coupled to the shielding driver circuitry to receive electrical currents which produce electromagnetic fields to offset electromagnetic fields induced by currents in the one or more circuits supported by the second substrate.

In another aspect, a first substrate including a pixel array in which a plurality of unit pixels is arranged in a first direction and a second direction; a second substrate including a logic circuit configured to receive a pixel signal from the plurality of unit pixels; and a shielding layer disposed between the first substrate and the second substrate, wherein the shielding layer includes: a plurality of first metal lines extending in the first direction; and a first shielding driver configured to apply a current to at least one of the first metal lines.

In some implementations, the conductive lines in the shielding layer includes a plurality of first metal lines extending in the first direction and the shielding driver circuitry is configured to apply a current to at least one of the first metal lines, and the plurality of unit pixels is arranged to overlap with a region between the first metal lines adjacent to each other.

In some implementations, the shielding layer may include a plurality of second metal lines extending in the second direction and the shielding driver circuitry is further coupled and configured to apply a current to at least one of the second metal lines.

In some implementations, the plurality of unit pixels is arranged to overlap with a region between the first metal lines that are adjacent to each other and the second metal lines that are adjacent to each other.

In some implementations, the one or more circuits supported by the second substrate include at least one of a row driver, a correlated double sampler (CDS), an analog-digital converter (ADC), an output buffer, a column driver, or a timing controller.

In some implementations, the pixel array includes at least one of a reset transistor, a transfer transistor, a drive transistor, or a selection transistor.

In some implementations, the first metal lines are spaced apart from each other at intervals of a first distance, wherein the first distance is longer than a distance between rows of the pixel array.

In some implementations, the second metal lines are spaced apart from each other at intervals of a second distance, wherein the second distance is longer than a distance between columns of the pixel array.

In another aspect, an image sensing device may include a first substrate including a plurality of image sensing pixels arranged in a pixel array to generate pixel signals by converting incident light, a second substrate including circuitry configured to generate image data based on the pixel signals from the pixel array, a shielding layer disposed between the first substrate and the second substrate and structured to include metal lines and shielding driver circuit coupled to supply currents to the metal lines and a shielding controller configured to determine an address of a pixel that generates a pixel signal including noise and a level of the noise in the pixel signal based on the image data and provide a control signal to the shielding layer to generate a counter electromagnetic field that has a polarity opposite to electromagnetic fields that creates the noise, wherein the shielding driver circuitry is configured to generate the counter electromagnetic field through a current provided to at least one of the metal lines based on the control signal.

In some implementations, if the level of the noise is equal to or greater than a predetermined value, the shielding controller outputs the control signal.

In some implementations, the shielding controller outputs the control signal for offsetting the noise for each row in the pixel array.

In some implementations, wherein the metal lines in the shielding layer may include a plurality of first metal lines extending in a row direction of the pixel array, a plurality of second metal lines extending in a column direction of the pixel array, and the shielding driver circuitry is coupled and configured to generate a counter electromagnetic field through at least one of the second metal lines based on the control signal.

In some implementations, the shielding controller outputs the control signal for offsetting the noise for each unit pixel included in the pixel array.

In some implementations, the pixel array is arranged to overlap with the first metal lines.

In some implementations, the pixel array is arranged to overlap with the first metal lines and the second metal lines.

In accordance with an embodiment of the disclosed technology, an image sensing device may include a pixel array region structured to include a plurality of image sensing pixels arranged in rows and columns to produce pixel signals by converting incident light, a circuit region structured to include circuitry to process the pixel signal produced by the plurality of image sensing pixels and a shielding layer disposed between the pixel array region and the circuit region and including a plurality of shielding metal lines coupled to a decoder configured to select one or more of the shielding metal lines to provide a current to selected shielding metal lines to generate counter electromagnetic fields, wherein the counter electromagnetic fields have a polarity opposite to electromagnetic fields that are induced in the pixel array region.

In some implementations, wherein the plurality of shielding metal lines is arranged in rows and columns, and the decoder includes a row decoder and a column decoder.

In some implementations, wherein the decoder selects the one or more of the shielding metal lines to provide the current by comparing the pixel signals to a threshold value for determining whether to apply the counter electromagnetic fields.

It is to be understood that both the foregoing general description and the following detailed description of the disclosed technology are illustrative and explanatory and are intended to provide further explanation of the disclosure as claimed.

DETAILED DESCRIPTION

Figure 1:
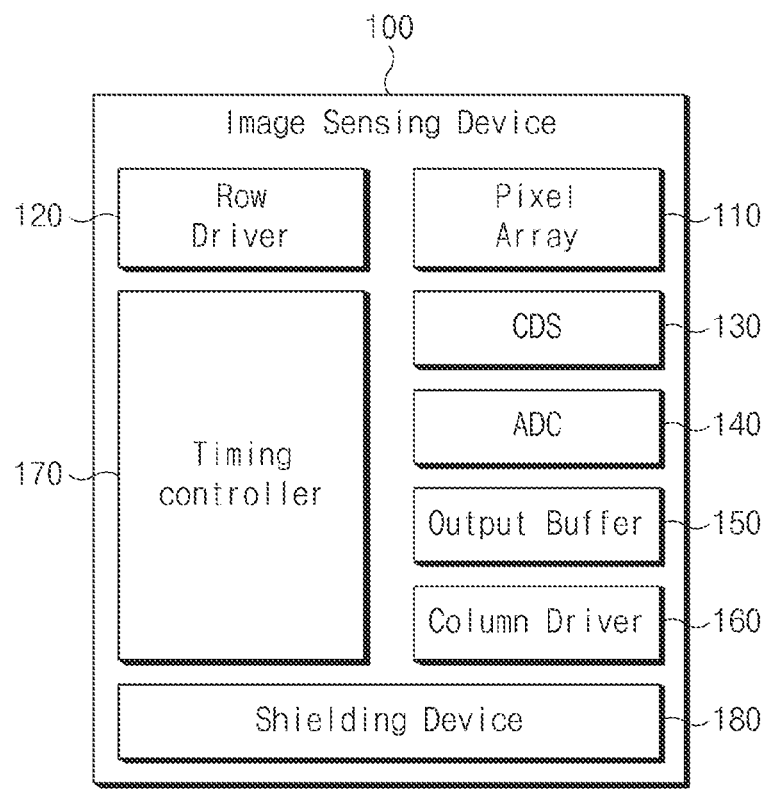
FIG. 1 is a block diagram illustrating an example of an image sensing device based on some implementations of the disclosed technology.

This patent document provides implementations and examples of an image sensing device including a shielding device and the disclosed technology may be implemented to achieve one or more advantages in imaging applications. Some implementations of the disclosed technology relate to the image sensing device structured to offset an electromagnetic field induced in a substrate, thereby improving noise robustness.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein, but on the contrary, the disclosure is intended to cover all modifications, equivalents, and alternatives falling within the spirit and scope of the embodiments.

FIG. 1 is a block diagram illustrating an example of an image sensing device 100 based on some implementations of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, a timing controller 170, and a shielding device 180. The components of the image sensing device 100 illustrated in FIG. 1 are discussed by way of example only, and this patent document encompasses numerous other changes, substitutions, variations, alterations, and modifications.

The pixel array 110 may include a plurality of unit pixels arranged in rows and columns. In one example, the plurality of unit pixels can be arranged in a two-dimensional (2D) pixel array including rows and columns. In another example, the plurality of unit pixels can be arranged in a three-dimensional (3D) pixel array. The plurality of unit pixels may convert an optical signal into an electrical signal on a unit pixel basis or a shared pixel basis, where two or more unit pixels in a pixel group share at least certain internal circuitry. The pixel array 110 may receive driving signals, including a row selection signal, a pixel reset signal and a transmission signal, from the row driver 120. Upon receiving the driving signal, corresponding unit pixels in the pixel array 110 may be activated to perform the operations corresponding to the row selection signal, the pixel reset signal, and the transmission signal. The row driver 120 may activate the pixel array 110 to perform certain operations on the unit pixels in the corresponding row based on commands and control signals provided by controller circuitry such as the timing controller 170. In some implementations, the row driver 120 may select one or more unit pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node. The reference signal indicating unique reset noise of each pixel and the image signal indicating the intensity of incident light may be generically called a pixel signal as necessary.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to one column counter, and image data can be generated by converting the correlate double sampling signals received from each column into digital signals using the column counter. In another embodiment of the disclosed technology, the ADC 140 may include a global counter to convert the correlate double sampling signals corresponding to the respective columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may operate as an interface configured to compensate for a difference in transmission speed (or in processing speed) between the image sensor 100 and another device coupled to the image sensor 100.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the column driver 160, the ADC 140, and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

The image sensing operation of the image sensing device 100 in FIG. 1 may be adversely impacted by various factors. One example of such factors is the electromagnetic interference caused by the circuitry of the image sensing device 100 such as electromagnetic interference caused by electromagnetic fields induced by electrical currents in the circuitry associated with the pixel array 110 (e.g., the driving circuitry and/or the readout circuitry). The disclosed technology can be implemented in some embodiments to provide electromagnetic shields that can reduce such undesired induced electromagnetic fields by blocking the electromagnetic field and/or applying opposite polarity magnetic and/or electric fields. In some implementations, the electromagnetic field may include a plurality of electromagnetic fields. In some implementations, the shielding device 180 can be used to prevent an electromagnetic field that can be induced in the image sensing device 100 from affecting the circuitry in the image sensing device 100, thereby reducing the generation of noise in the image data generated by the image sensing device 100. The shielding device 180 may be partially or entirely disposed in the shielding layer 300 (see FIG. 2). In some implementations, the shielding device 180 may include a metal line, a shielding driver, and a shielding controller.

Figure 2:
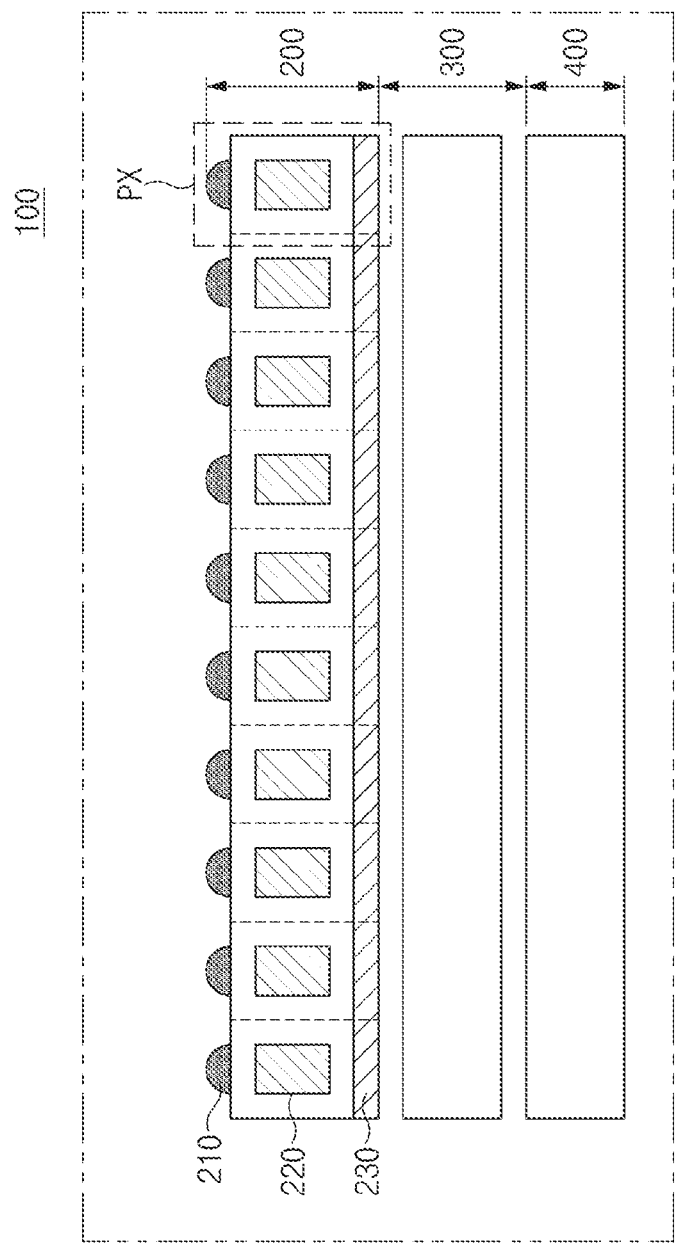
FIG. 2 is a cross-sectional view illustrating an example of an image sensing device based on some implementations of the disclosed technology.

FIG. 2 is a cross-sectional view illustrating an example of the image sensing device 100 based on some implementations of the disclosed technology.

Referring to FIG. 2, the image sensing device 100 may include a first substrate 200 that includes and/or supports the pixel array 110 for sensing incident light to capture images, a shielding layer 300 disposed below the first substrate 200, and a second substrate 400 disposed below the shielding layer 300. The shielding layer 300 may include at least one of a metal line, a shielding driver, and/or a shielding controller.

The second substrate 400 may include a logic gate region or a circuitry region. The logic gate region or circuitry region may be structured to include or support certain circuits in the image sensing device 100 such as, in some implementations, the row driver 120, the CDS 130, the ADC 140, the output buffer 150, the column driver 160, and the timing controller 170 shown in FIG. 1. In addition, the second substrate 400 may be coupled to the first substrate 200 through a signal line structured to carry electrical signals.

In some implementations, logic circuits are formed in the logic gate region of the second substrate 400. In other implementations, the logic circuits are formed on the first substrate 200 in addition to or in lieu of the second substrate 400.

In some implementations, the signal line may include a signal transmission line that carries electrical signals (e.g., a pixel signal) from the first substrate 200 to the logic circuits which are supported by or included in the second substrate 400. In other implementations, the signal line may include a signal transmission line that carries one or more electrical signals (e.g., a pixel reset signal, a transmission signal, etc.) from the second substrate 400 to the pixel array 110 included in or supported by the first substrate 200.

Although FIG. 2 illustrates the image sensing device 100 as including the first substrate 200 and the second substrate 400 by way of example, the image sensing device 100 may include more substrates other than the first substrate 200 and the second substrate 400.

The first substrate 200 may include the pixel array 110. As illustrated in FIG. 1, the pixel array 110 may include a plurality of unit pixels (PX) arranged in a two-dimensional (2D) matrix array. The plurality of unit pixels (PX) may be arranged in rows and columns in the pixel array 110.

Each unit pixel (PX) may include a microlens 210, a photoelectric conversion region 220, and a transistor region 230. The microlens 210 may allow light incident upon the pixel array 110 to be directed or guided to the photoelectric conversion region 220.

For example, the first substrate 200 may be a monocrystalline silicon substrate. The first substrate 200 may be a P-type or N-type bulk substrate. In one example, the first substrate 200 may be formed by growing a P-type or N-type epitaxial layer on the P-type bulk substrate. In another example, the first substrate 200 may be formed by growing a P-type or N-type epitaxial layer on the N-type bulk substrate.

The photoelectric conversion regions 220 may be disposed in the first substrate 200. In some implementations, the photoelectric conversion regions 220 may be disposed in the unit pixels (PX), respectively. That is, each unit pixel (PX) includes a photoelectric conversion region 220. For example, each photoelectric conversion region 220 may be a photodiode, a phototransistor, a photogate, a pinned photodiode (PPD), or a combination thereof.

The photoelectric conversion region 220 may include an N-type doped region that is formed by implanting N-type ions. In some implementations, the photoelectric conversion region 220 may include a stacked structure in which a plurality of doped regions is vertically stacked.

The photoelectric conversion region 220 may include a light receiving area that is sufficiently large to increase light reception (Rx) efficiency of the unit pixel (PX).

The transistor region 230 may include a reset transistor, a transfer transistor, a floating diffusion (FD) region, a drive transistor, a selection transistor, signal lines connected to the transistors in the transistor region 230.

The reset transistor may be activated in response to a reset signal, such that the reset transistor may reset a voltage of each unit pixel to a predetermined voltage level (e.g., a pixel voltage level).

In addition, when the reset transistor is activated, the transfer transistor may also be activated to reset the floating diffusion (FD) region.

Since the transfer transistor is activated in response to a transmission (Tx) signal, the transfer transistor can transmit photocharges accumulated in the photoelectric conversion region 220 of each pixel to the floating diffusion (FD) region.

The drive transistor may receive a pixel voltage through a drain terminal thereof, and may be coupled to the floating diffusion (FD) region through a gate terminal thereof. In addition, the drive transistor may be coupled to the selection transistor through a source terminal thereof.

The drive transistor may output a current corresponding to the voltage of the floating diffusion (FD) region coupled to a gate electrode thereof to a signal line through the selection transistor.

The selection transistor may be activated in response to a selection signal applied to a gate electrode thereof, such that the selection transistor may transmit an output signal of the drive transistor to a signal line.

The reset signal, the transmission signal, and the selection signal may be received from the row driver 120 (see FIG. 1).

Analog signals are transmitted from the transistor region 230 to an analog-to-digital conversion (ADC) circuit through the signal line and converted into digital image signals.

In some implementations, a plurality of unit pixels (PX) is arranged in rows and columns in the pixel array 110, and the photo-generated electrical charge generated by the unit pixels (PX) may be transferred to the transistor region 230 on a row basis.

The shielding controller may locate where the noise has been generated in the pixel array 110 using the image signal detected in a test mode. During the test mode, an image signal is obtained for noise detection purposes and the image data is transmitted from the image sensing device 100 to the shielding controller to determine the location of the noise source. In one example, electromagnetic fields may be the noise source, and the shielding controller can locate electromagnetic fields that interfere with the circuitry in the image sensing device 100.

In some implementations, the image sensing device 100 may capture images with high sensitivity in the test mode, and such operations may be performed by placing the image sensing device 100 in a low-illuminance environment or a high-illuminance environment.

The image sensing device 100 may have a high sensitivity when its floating diffusion (FD) region has a low capacitance. When the image sensing device 100 has a high sensitivity, image data that is generated by the image sensing device 100 is susceptible to noise.

If no noise is detected during the test mode operation in the low-illuminance environment, the image signal of each unit pixel (PX) of the image sensing device 100 may output either a minimum value or a unique noise value for each pixel. In this case, the unique noise value may include a noise value that is inherent in the pixel structure of each of the unit pixels.

In some implementations, the shielding controller may compare an image signal to a predetermined value such as the minimum value or the unique noise value to determine whether the image signal has been affected by noise. For example, the shielding controller may determine that the image signal has been affected by noise when the image signal has a value that is equal to or larger than a predetermined value. The shielding controller may determine the location of the noise source and the level of the noise based on the image signal.

If no noise is detected during the test mode operation in the high-illuminance environment, the image signal of each unit pixel (PX) of the image sensing device 100 may output either a maximum value or a saturation signal. In some implementations, the shielding controller may compare an image signal to a predetermined value such as the maximum value or the saturation signal to determine whether the image signal has been affected by noise. For example, the shielding controller may determine that the image signal has been affected by noise when the image signal has a value that is equal to or smaller than a predetermined value. The shielding controller may determine the location of the noise source and the level of the noise based on the image signal.

In some implementations, the shielding controller may compare image signals obtained from the unit pixels (PX) with each other on a row by row basis, or may compare the image signals with each other in units of a predetermined number of adjacent pixels to detect the image signals affected by noise. In some implementations, if an image signal that is obtained from a set of pixels corresponding to a certain row of the pixel array 110 is determined to be affected by noise, or if an image signal that is obtained from a predetermined number of adjacent pixels is determined to be affected by noise, the shielding controller may determine that the image signal has been affected by noise caused by electromagnetic fields induced in the image sensing device 100. In this way, the shielding controller may determine the location of the noise source and the level of the noise.

The low-illuminance environmental test mode and the high-illuminance environmental test mode may be performed as part of a test process of the image sensing device 100 during or after the fabrication process of the image sensing device 100.

In some implementations, the shielding controller may compare image data segments captured by the image sensing device 100 with each other on a frame-by-frame basis, determining the location of the noise source and the level of the noise based on the comparison. In other words, noise can be detected when capturing images by the image sensing device 100.

The frame may refer to a unit of image data segments generated based on the image signals obtained during an image acquisition by the image sensing device 100.

For example, the shielding controller may compare two frames captured within a predetermined time with each other, and determine the location of the noise source and the level of the noise based on the comparison.

Noise is added to the image data when the current generated by the second substrate 400 creates electromagnetic fields that interfere with electrical signals on the first substrate 200. In other words, during the operation of the image sensing device 100, the electromagnetic fields resulting from the current generated by the second substrate 400 may cause noise to be added to signals that are generated by the unit pixels (PX) included in the first substrate 200.

As described above, the second substrate 400 may include a logic region or circuitry region in which various circuits or logic circuits are disposed, and an interconnect region in which interconnect lines such as metal lines connected to the logic circuits are disposed. The interconnect region may include interconnect lines through which external circuits are connected to the logic circuits of the second substrate 400, connection lines coupled between the logic circuits, and the like.

The electrical signals applied to the logic circuits of the image sensing device 100 may induce electromagnetic fields.

In some implementations, electromagnetic fields may be induced by the current applied to conductive lines connected to the logic circuits. The intensity of the induced electromagnetic fields may be proportional to the intensity of the current flowing in a conductive line, and may be inversely proportional to the distance from the center of the conductive line.

The electromagnetic fields induced in the logic circuit may generate an electromotive force with respect to signal lines (e.g., a control signal line, a pixel signal line, etc.) in the first substrate 200. If a current is generated in the signal lines arranged in the first substrate 200 due to the induced electromotive force, the generated current may serve as a noise source for the pixel signal. For example, the electromagnetic field generated in the second substrate 400 may affect the pixel signal generated from the unit pixel (PX). Noise in the pixel signal that is caused by the electromagnetic fields may have a spatial pattern that is similar in shape to the interconnect region of the second substrate 400, and such noise can be detected from the image data captured by the image sensing device 100.

The transistor region 230 of the first substrate 200 may include signal lines such as the control signal line or the pixel signal line. The signal lines may include a conductive material. The signal lines may form a conductor loop in the transistor region 230.

For the conductor loop, if electromagnetic fields passing through the conductor loop is applied, an electromotive force and a current flowing through the conductor loop may be induced. As the electromagnetic field induced in the second substrate 200 passes through the conductor loop formed in the first substrate 200, a current may be induced in the conductor loop. The magnitude of the induced current in the conductor loop may be proportional to the intensity of the electromagnetic fields generated in the second substrate 400.

The intensity of the electromagnetic field generated in the second substrate 400 may be proportional to the intensity of the current flowing in the conductive line included in the second substrate 400, and may be inversely proportional to the distance between the conductive line included in the second substrate 400 and the position of the electromagnetic field generated in the second substrate 400.

If the distance between the second substrate 400 and the first substrate 200 is not far enough to avoid the electromagnetic interference, the electromagnetic fields generated in the second substrate 400 can affect the conductor loop formed in the first substrate 200.

The shielding layer 300 may include at least one of a metal line, a shielding driver, and/or a shielding controller that are included in the shielding device 180. In some implementations, the shielding layer 300 may include the metal line and the shielding driver, and the shielding controller may be disposed outside the shielding layer 300.

The shielding device 180 may generate electromagnetic fields for offsetting the induced electromagnetic field in the second substrate 400. By actively offsetting the electromagnetic field induced in the second substrate 400, the image sensing device 100 can reduce or minimize the noise in the image data. In some implementations, the electromagnetic field generated by the shielding device 180 to offset the effect of the induced electromagnetic field in the second substrate 400 may be referred to as a counter electromagnetic field because it counteracts the induced electromagnetic field or reduces the effect of the induced electromagnetic field.

The shielding device 180 may include a plurality of metal lines. In some implementations, the shielding device 180 may further include the shielding driver and the shielding controller that are connected to the metal lines. The metal lines may extend parallel to the row and/or column direction of the pixel array 110. The metal lines may include a conductive material such as metal. The shielding controller may detect noise from the image data through the test mode. In addition, the shielding controller may output a control signal to the shielding driver to reduce or remove the noise.

The shielding driver may adjust the intensity and/or direction of the current flowing in each of the metal lines. The shielding driver may adjust the intensity and direction of the current flowing in the metal lines by decoding the control signal received from the shielding controller. The current flowing in each of the metal lines may be referred to as a counter magnetic (and/or electrical) field generation current (CMC).

As described above, the shielding controller may determine the location of the noise source and the level of the noise based on the image data detected in the test mode.

The shielding controller may determine a control signal to be applied to the shielding device 180 based on the location of the noise source and the level of the noise. The shielding device 180 may adjust the intensity and/or direction of the counter magnetic (and/or electrical) field generation current (CMC) flowing in the metal lines to offset the induced electromagnetic field that is vertically applied from the second substrate 400 to the first substrate 200.

In some implementations, the shielding device 180 can adjust the intensity and direction of the induced electromagnetic field caused by the counter magnetic field generation current (CMC) flowing in the metal lines (e.g., straight conductive lines). The shielding device 180 may independently control the intensity and direction of the counter magnetic (and/or electrical) field generation current (CMC) for each metal line, thereby actively adjusting the influence of the electromagnetic field generated by the second substrate 400. The operations of the shielding device 180 may be controlled to adjust the intensity and/or direction of the induced electromagnetic fields as will be discussed below with reference to FIGS. 4 and 6.

The unit pixels (PX) disposed in the pixel array 110 may be activated on a row-by-row basis. Accordingly, the induced electromagnetic fields generated by the second substrate 400 may be disposed in the same row on the pixel array 110, affecting the pixel signals of the activated unit pixels (PX). The shielding device 180 may reduce or remove the noise caused by the induced electromagnetic fields for a specific row of the pixel array 100 through the metal lines extending in the row direction of the pixel array 110.

In some other implementations, the shielding device 180 may selectively reduce or remove the noise caused by the induced electromagnetic fields for a specific region of the pixel array 110 using all of the metal lines extending in the row and column directions of the pixel array 110.

Figure 3:
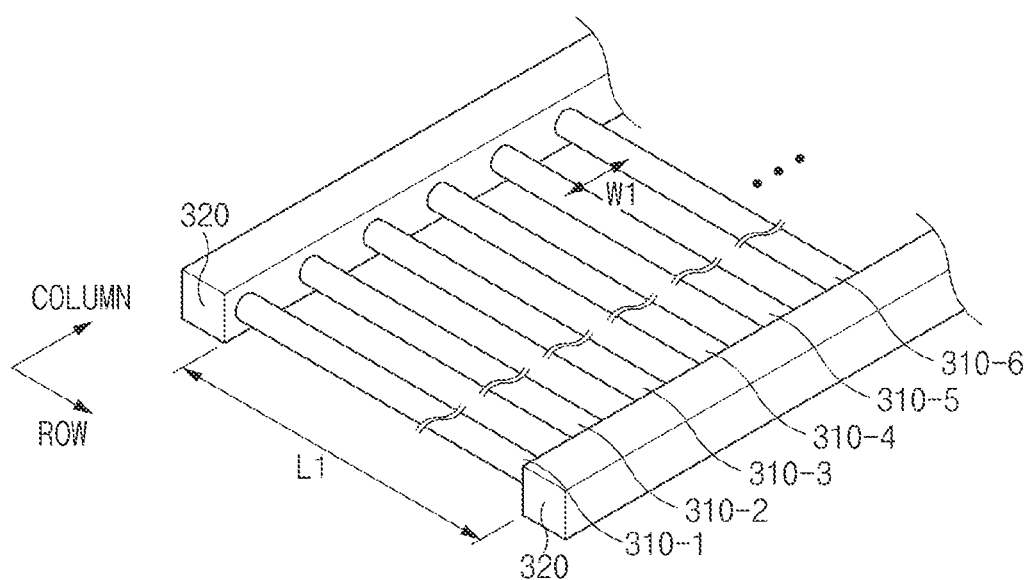
FIG. 3 is a perspective view illustrating an example of a shielding layer based on some implementations of the disclosed technology.

FIG. 3 is a perspective view illustrating an example of a shielding layer 300a based on some implementations of the disclosed technology.

Referring to FIG. 3, the shielding layer 300a may include a plurality of first metal lines (310-1, 310-2, 310-3, 310-4, etc.), and a first shielding driver 320. The first metal lines (310-1, 310-2, 310-3, 310-4, etc.) may extend in the row direction of the pixel array 110.

A length L1 of each of the first metal lines (310-1, 310-2, 310-3, 310-4, etc.) may be equal to or longer than the row-directional width of the pixel array 110.

Rows of the unit pixels (PX) disposed in the pixel array 110 may overlap with regions arranged between the adjacent first metal lines (e.g., 310-1 and 310-2).

Since the length L1 of each of the first metal lines (310-1, 310-2, 310-3, 310-4, etc.) is equal to or longer than the row-directional width of the pixel array 110, the induced electromagnetic field caused by the second substrate 400 can be offset against the entirety of the unit pixels (PX) included in the row direction of the pixel array 110.

The distance W1 in the column direction between the first metal lines (310-1, 310-2, 310-3, 310-4, etc.) may be equal to or longer than the distance between pixel rows of the pixel array 110. For example, the distance in the column direction W1 between the first metal lines (310-1, 310-2, 310-3, 310-4, etc.) may be twice the distance between the pixel rows of the pixel array 110.

The size and/or structure of the shielding region of the shielding device 180 for shielding the induced electromagnetic field may be modified depending on the distance W1 in the column direction between the first metal lines (310-1, 310-2, 310-3, 310-4, etc.). For example, when the distance W1 in the column direction between the first metal lines (310-1, 310-2, 310-3, 310-4, etc.) is excessively longer than the distance between the pixel rows of the pixel array 110 (e.g., two or more times the distance between the pixel rows of the pixel array 110), it may be difficult to precisely adjust the counter electromagnetic fields for the rows of the unit pixels (PX) disposed between two first metal lines (e.g., 310-1 and 310-2) adjacent to each other.

When the distance W1 in the column direction between the first metal lines (310-1, 310-2, 310-3, 310-4, etc.) is shorter than the distance between the pixel rows of the pixel array 110, the level of current consumption by the shielding device 180 for adjusting the counter electromagnetic field may be excessive, the fabrication process of the shielding device 180 may become complicated. Accordingly, the distance W1 in the column direction between the first metal lines (310-1, 310-2, 310-3, 310-4, etc.) may be experimentally determined based on the requirements discussed above.

The first shielding driver 320 may decode the control signal received from the shielding controller to apply the counter magnetic field generation current (CMC) to each of the first metal lines (310-1, 310-2, 310-3, 310-4, etc.). The counter magnetic field generation currents may vary depending on the first metal lines 310 they are applied to. In some implementations, the counter magnetic field generation currents may be used to generate opposite polarity magnetic and/or electric fields.

Figure 4:
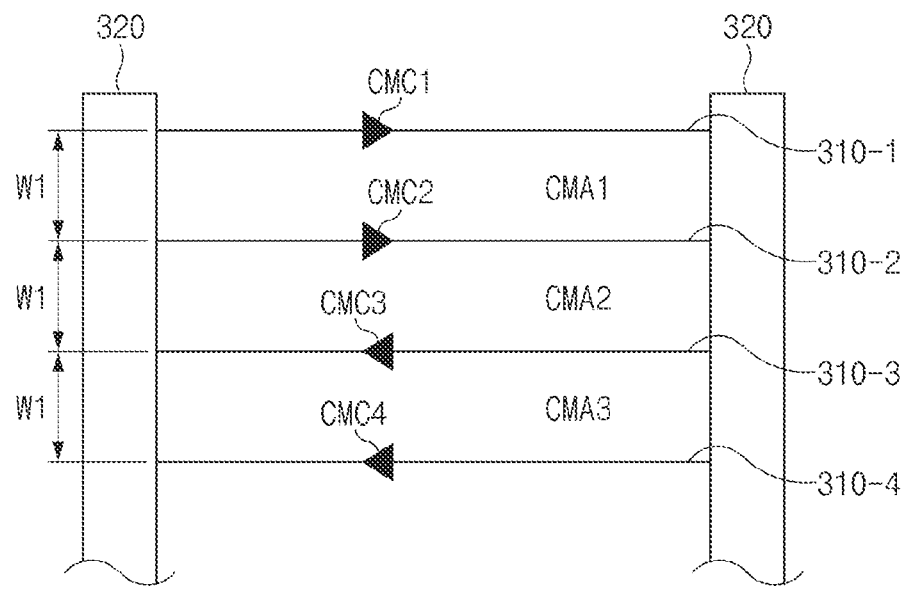
FIG. 4 is a schematic diagram illustrating an example of a counter electromagnetic field for each region generated in the shielding layer based on some implementations of the disclosed technology.

FIG. 4 is a schematic diagram illustrating an example of the counter magnetic field for each region generated in the shielding layer 300a based on some implementations of the disclosed technology.

Although the shielding layer 300a includes a predetermined number of first metal lines (310-1, 310-2, 310-3, 310-4, etc.), FIG. 4 illustrates only four first metal lines 310-1, 310-2, 310-3, and 310-4 for convenience of description.

The first driver 310 may apply the first, second, third, and fourth counter magnetic field generation currents CMC1, CMC2, CMC3, and CMC4 to the first metal lines 310-1, 310-2, 310-3, and 310-4, respectively. The intensity and direction of the counter magnetic field generation current (CMC) flowing in the first metal lines 310-1, 310-2, 310-3, and 310-4 may vary depending on the intensity and direction of the induced magnetic field generated in the second substrate 400.

For example, it is assumed that the first counter magnetic field generation current CMC1 and the second counter magnetic field generation current CMC2 flow in the same direction, the third counter magnetic field generation current CMC3 and the fourth counter magnetic field generation current CMC4 flow in the same direction, and the second counter magnetic field generation current CMC2 and the third counter magnetic field generation current CMC3 flow in different directions.

A plurality of regions may be separated from each other by the first metal lines 310-1, 310-2, 310-3, and 310-4, and the counter magnetic field may occur in each of the regions. Here, the respective regions may be referred to as counter magnetic field generation regions CMA1 to CMA3 for convenience of description.

The intensity and direction of the counter magnetic field generated in the first to third counter magnetic field generation regions CMA1 to CMA3 may be determined by the sum or difference of the magnetic fields respectively generated in the first metal lines 310-1, 310-2, 310-3, and 310-4.

The magnetic field generated by the current flowing in the conductive line may be inversely proportional to the distance from the conductive line, and may be proportional to the intensity of the current flowing in the conductive line.

If the distance between the first metal lines 310-1, 310-2, 310-3, and 310-4 is sufficiently long (e.g., if the distance between the first metal lines 310-1, 310-2, 310-3, and 310-4 is longer than the distance between the pixel rows of the pixel array 110), and if the magnitude of the counter magnetic field generation current (CMC) is sufficiently small, the counter magnetic field generated between two first metal lines (e.g., 310-1 and 310-2) adjacent to each other may approximate the sum or difference of the magnetic fields generated in the two first metal lines (e.g., 310-1 and 310-2).

The magnitude of the counter magnetic field generation current (CMC) that is sufficiently small indicates that the magnetic field generated in the first metal line (e.g., 310-2) is small enough not to affect the counter magnetic field generation region (e.g., CMA3 in case of 310-2) that is not adjacent to the first metal line.

When the directions of the counter magnetic field generation currents CMC1 and CMC2 respectively flowing in two first metal lines (e.g., 310-1 and 310-2) are identical to each other, the magnetic fields generated between the first metal lines 310-1 and 310-2 can be offset against each other.

In contrast, when the directions of the counter magnetic field generation currents CMC2 and CMC3 respectively flowing in the two adjacent first metal lines (e.g., 310-2 and 310-3) are different from each other, the magnetic fields generated between the first metal lines 310-1, 310-2, 310-3, and 310-4 may mutually supplement and reinforce each other.

Accordingly, the shielding device 180 may adjust the intensity and direction of each of the counter magnetic field generation currents CMC1 to CMC4 respectively flowing in the first metal lines 310-1, 310-2, 310-3, and 310-4 to adjust the intensity and direction of each of the counter magnetic fields respectively generated in the first to third counter magnetic field generation regions CMA1 to CMA3.

For example, the first counter magnetic field generation region CMA1 shown in FIG. 4 may be defined by the sum or difference of the induced magnetic field generated by the first metal line 310-1 receiving the first counter magnetic field generation current CMC1 and the induced magnetic field generated by the first metal line 310-2 receiving the second counter magnetic field generation current CMC2.

The counter magnetic field applied to each of the counter magnetic field generation regions CMA1 to CMA3 may be determined by the direction and intensity of each of the counter magnetic field generation currents CMC1 to CMC4 respectively applied to the first metal lines 310-1, 310-2, 310-3, and 310-4.

For example, as shown in FIG. 4, when the first counter magnetic field generation current CMC1 flows from the left side to the right side in the row direction of the pixel array 110, the direction of the magnetic field (i.e., the direction along which the magnetic field is vertically incident upon a plane) that is generated by the first counter magnetic field generation current CMC1 in the first counter magnetic field generation region CMA1 can be assumed to be a positive(+) direction for convenience of description.

When the second counter magnetic field generation current CMC2 flows in the same direction as the first counter magnetic field generation current CMC1, the direction of the magnetic field generated by the second counter magnetic field generation current CMC2 in the first counter magnetic field generation region CMA1 may be referred to as a negative(−) direction. This is because the direction of the induced magnetic field induced by the current flowing in the conductive line is based on Ampere's right-hand screw rule.

The magnitude of the counter magnetic field generated in the first counter magnetic field generation region CMA1 may vary depending on the distance from the center of the first counter magnetic field generation region CMA1 to each of the first metal lines 310-1 and 310-2 configured to define the first counter magnetic field generation region CMA1.

When the distance W1 in the column direction between the adjacent first metal lines 310-1, 310-2, 310-3, and 310-4 is constant, the intensity of the counter magnetic field generated in the counter magnetic field generation regions CMA1 to CMA3 by the first metal lines 310-1, 310-2, 310-3, and 310-4 may be inversely proportional to the distance W1 in the column direction between the first metal lines 310-1, 310-2, 310-3, and 310-4.

In association with the first counter magnetic field generation region CMA1, if the counter magnetic field generated by the first counter magnetic field generation current CMC1 and the second counter magnetic field generation current CMC2 is referred to as a first counter magnetic field B1, and if the length L1 of each of the first metal lines 310-1, 310-2, 310-3, and 310-4 is sufficiently long, the first counter magnetic field B1 may be represented by the following equation 1.

$$B1 = \left(\frac{CMC1}{W1} - \frac{CMC2}{W1}\right) * k * 2 \qquad \text{(Eq. 1)}$$

In Equation 1, k may be denoted by "k=2*10^(−7)", and the unit of the value of k may be denoted by (T*m/A). The unit of the counter magnetic field generation current (e.g., CMC1) may be ampere (A), and the unit of the distance (e.g., W1) in the column direction between the metal lines may be meter (m).

Similarly, in association with the second counter magnetic field generation region CMA2, if the generated counter magnetic field is referred to as a second counter magnetic field B2, the second counter magnetic field B2 can be represented by the following equation 2.

$$B2 = \left(\frac{CMC2}{W1} + \frac{CMC3}{W1}\right) * k * 2 \qquad \text{(Eq. 2)}$$

In addition, in association with the third counter magnetic field generation region CMA3, if the generated counter magnetic field is referred to as the third counter magnetic field B3, the third counter magnetic field B3 can be represented by the following equation 3.

$$B3 = \left(-\frac{CMC3}{W1} + \frac{CMC4}{W1}\right) * k * 2 \qquad \text{(Eq. 3)}$$

Since the shielding device 180 may adjust the counter magnetic field generation currents CMC1 to CMC4, the shielding device 180 can offset the induced magnetic field generated in the second substrate 400.

Figure 5:
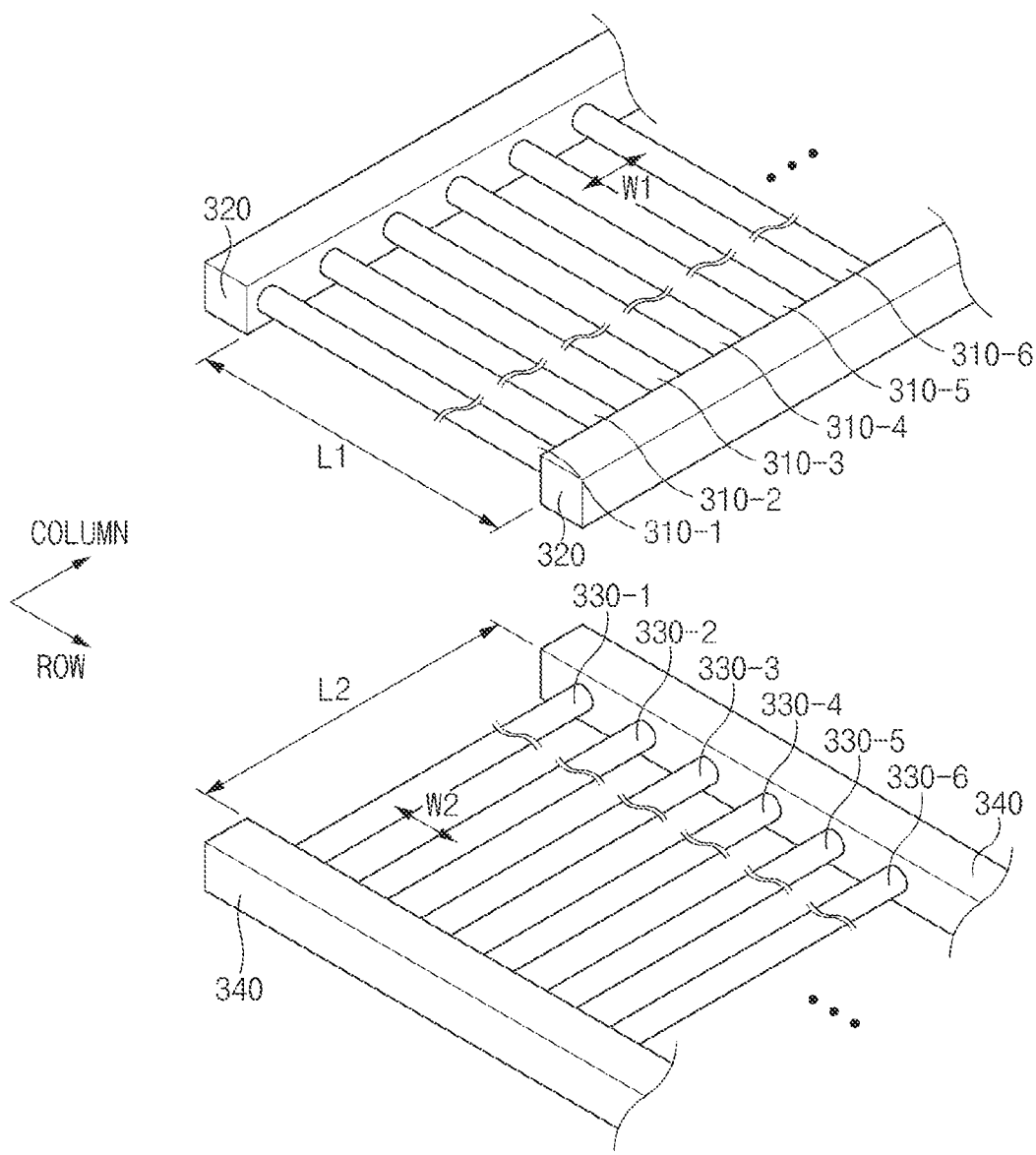
FIG. 5 is a perspective view illustrating another example of a shielding layer based on some implementations of the disclosed technology.

FIG. 5 is a perspective view illustrating another example of a shielding layer 300b based on some implementations of the disclosed technology.

Referring to FIG. 5, the shielding layer 300b may include the first metal lines (310-1, 310-2, 310-3, 310-4, etc.), the first shielding driver 320, the second metal lines (330-1, 330-2, 330-3, 330-4, etc.), and the second shielding driver 340.

In some implementations, the configurations of the first metal lines (310-1, 310-2, 310-3, 310-4, etc.) and the first shielding driver 320 shown in FIG. 5 is similar or identical to those of FIG. 3.

Each of the second metal lines (330-1, 330-2, 330-3, 330-4, etc.) may extend in the column direction of the pixel array 110. The length L2 of each of the second metal lines (330-1, 330-2, 330-3, 330-4, etc.) may be equal to or longer than the width in the column direction of the pixel array 110.

Since the length L2 of each of the second metal lines (330-1, 330-2, 330-3, 330-4, etc.) is equal to or longer than the width in the column direction of the pixel array 110, the shielding device 180 can shield the induced electromagnetic field for all of the unit pixels (PX) included in the columns of the pixel array 110.

The distance W2 in the row direction between the second metal lines (330-1, 330-2, 330-3, 330-4, etc.) may be equal to or longer than the distance between pixel columns of the pixel array 110. For example, the distance W2 in the row direction between the second metal lines 330 may be twice the distance between the pixel columns of the pixel array 110.

The size and/or structure of the shielding region of the shielding device 180 for shielding the induced electromagnetic field shielding region of the shielding device 180 may be modified depending on the distance W2 in the row direction between the second metal lines (330-1, 330-2, 330-3, 330-4, etc.). For example, when the distance W2 in the row direction between the second metal lines (330-1, 330-2, 330-3, 330-4, etc.) is excessively longer than the distance between the pixel columns of the pixel array 110 (e.g., two or more times the distance between the pixel columns of the pixel array 110), it may be difficult to precisely adjust the counter electromagnetic field for the pixel columns of the unit pixels (PX) disposed between the second metal lines (330-1, 330-2, 330-3, 330-4, etc.).

On the other hand, when the distance W2 in the row direction between the second metal lines (330-1, 330-2, 330-3, 330-4, etc.) is shorter than the distance between the pixel columns of the pixel array 110, the level of current consumption by the shielding device 180 for adjusting the counter electromagnetic field may be excessive, and the fabrication process of the shielding layer 300b may become complicated. Accordingly, the distance W2 in the row direction between the second metal lines (330-1, 330-2, 330-3, 330-4, etc.) may be experimentally determined based on the requirements discussed above.

The shielding device 180 may selectively generate the counter electromagnetic field for a certain region of the pixel array 110 through the first metal lines (310-1, 310-2, 310-3, 310-4, etc.), the first shielding driver 320, the second metal lines (330-1, 330-2, 330-3, 330-4, etc.), and the second shielding driver 340.

The second shielding driver 340 may decode the control signal received from the shielding controller to apply the counter magnetic field generation current (CMC) to each of the second metal lines (330-1, 330-2, 330-3, 330-4, etc.). The counter magnetic field generation currents respectively applied to the second metal lines (330-1, 330-2, 330-3, 330-4, etc.) may be different in magnitude and direction from each other.

The first shielding driver 320 may adjust the counter magnetic field generation current (CMC) flowing in the first metal lines (310-1, 310-2, 310-3, 310-4, etc.) to adjust the counter electromagnetic field in the row direction of the pixel array 110. In addition, the second shielding driver 340 may adjust the counter magnetic field generation current (CMC) flowing in the second metal lines (330-1, 330-2, 330-3, 330-4, etc.) to adjust the counter electromagnetic field in the column direction of the pixel array 110. The counter electromagnetic field may be adjusted as will be discussed below with reference to FIG. 6.

Figure 6:
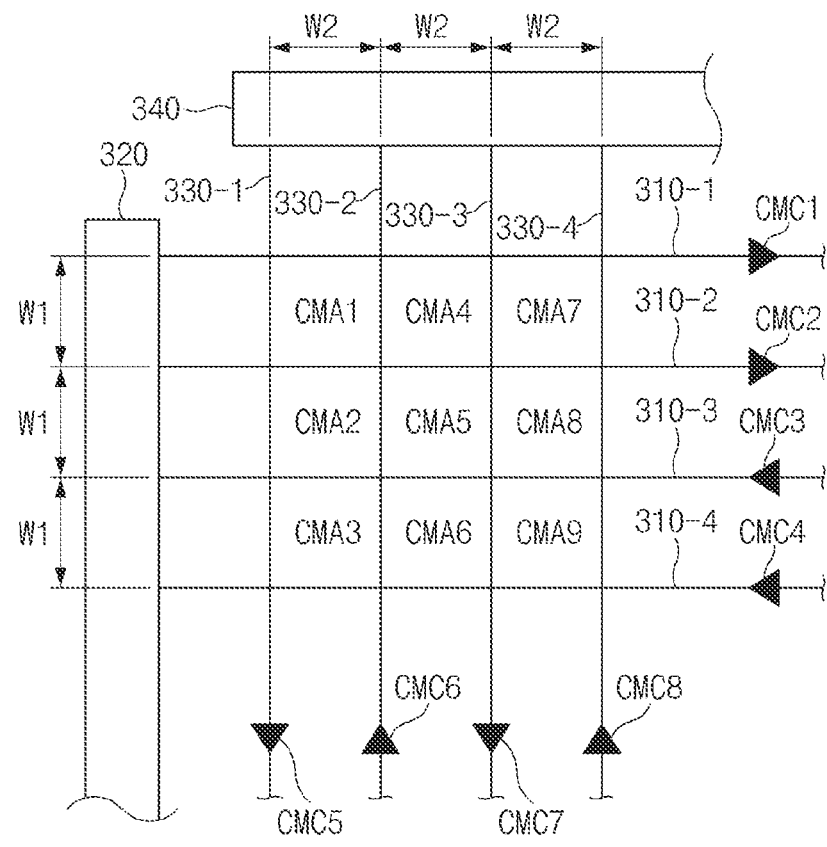
FIG. 6 is a schematic diagram illustrating another example of a counter electromagnetic field for each region generated in the shielding layer based on some implementations of the disclosed technology.

FIG. 6 is a schematic diagram illustrating another example of the counter electromagnetic field for each region generated in the shielding layer 300b based on some implementations of the disclosed technology.

The shielding layer 300b may include a predetermined number of first metal lines (310-1, 310-2, 310-3, 310-4, etc.) and a predetermined number of second metal lines (330-1, 330-2, 330-3, 330-4, etc.). The number of the first metal lines (310-1, 310-2, 310-3, 310-4, etc.) and the number of the second metal lines (330-1, 330-2, 330-3, 330-4, etc.) may be experimentally determined depending on the arrangement shape and size of the unit pixels (PX) included in the pixel array 110.

For convenience of description, FIG. 6 illustrates only four first metal lines 310-1, 310-2, 310-3, and 310-4 and only four second metal lines 330-1, 330-2, 330-3, and 330-4.

The first, second, third, and fourth counter magnetic field generation currents CMC1, CMC2, CMC3, and CMC4 may be applied to the first metal lines 310-1, 310-2, 310-3, and 310-4 included in the shielding layer 300b, respectively. The fifth, sixth, seventh, and eighth counter magnetic field generation currents CMC5, CMC6, CMC7, and CMC8 may be applied to the second metal lines 330-1, 330-2, 330-3, and 330-4 included in the shielding layer 300b, respectively.

The first shielding driver 320 may apply the first, second, third, and fourth counter magnetic field generation currents CMC1, CMC2, CMC3, and CMC4 to the first metal lines 310-1, 310-2, 310-3, and 310-4, respectively.

The second shielding driver 340 may apply the fifth, sixth, seventh, and eighth counter magnetic field generation currents CMC5, CMC6, CMC7, and CMC8 to the second metal lines 330-1, 330-2, 330-3, and 330-4, respectively. The intensity and direction of each of the counter magnetic field generation currents CMC1 to CMC8 flowing in the first metal lines 310-1, 310-2, 310-3, and 310-4 and the second metal lines 330-1, 330-2, 330-3, and 330-4 may vary depending on the intensity and direction of the induced magnetic field generated in the second substrate 400.

For example, it is assumed that the first counter magnetic field generation current CMC1 and the second counter magnetic field generation current CMC2 may flow in the same direction, the third counter magnetic field generation current CMC3 and the fourth counter magnetic field generation current CMC4 may flow in the same direction, and the second counter magnetic field generation current CMC2 and the third counter magnetic field generation current CMC3 flow in different directions.

In addition, it is assumed that the fifth counter magnetic field generation current CMC5 and the seventh counter magnetic field generation current CMC7 flow in the same direction, the sixth counter magnetic field generation current CMC6 and the eighth counter magnetic field generation current CMC8 flow in the same direction, and the fifth counter magnetic field generation current CMC5 and the sixth counter magnetic field generation current CMC6 flow in different directions.

A plurality of regions may be disposed between the first metal lines 310-1, 310-2, 310-3, and 310-4 and the second metal lines 330-1, 330-2, 330-3, and 330-4, and the counter magnetic field may occur in each of the regions. Here, the respective regions will hereinafter be referred to as counter magnetic field generation regions CMA1 to CMA9.

A predetermined number of the unit pixels (PX) included in the pixel array 110 may be disposed to overlap with the counter magnetic field generation regions CMA1 to CMA9.

The counter magnetic field of each of the counter magnetic field generation regions may be determined by the sum or difference of the magnetic fields generated in the first metal lines 310-1, 310-2, 310-3, and 310-4 and the second metal lines 330-1, 330-2, 330-3, and 330-4.

In order to approximate the counter magnetic field generated in the counter magnetic field generation region of the shielding layer 300b, it may be assumed that the distance between the first metal lines 310-1, 310-2, 310-3, and 310-4 is sufficiently long (e.g., that the distance between the first metal lines is longer than the distance between the pixel rows of the pixel array 110), and the distance between the second metal lines 330-1, 330-2, 330-3, and 330-4 is sufficiently long (e.g., that the distance between the second metal lines is longer than the distance between the pixel columns of the pixel array 110).

In addition, it may be assumed that the magnitude of the counter magnetic field generation current applied to the first metal lines 310 and the second metal lines 330 is sufficiently small.

The magnitude of the counter magnetic field generation current that is sufficiently small indicates that the magnetic field generated in any metal line (e.g., 310-2) is small enough not to affect the counter magnetic field generation region (e.g., CMA3 in case of 310-2) that is not adjacent to the metal line.

The counter magnetic field applied to the arbitrary counter magnetic field generation region (e.g., CMA1) under the above-mentioned condition may approximate the sum or difference of the induced magnetic field generated by two first metal lines (e.g., 310-1 and 310-2) defining the counter magnetic field generation region and the induced magnetic field generated by two second metal lines (e.g., 330-1 and 330-2) defining the counter magnetic field generation region.

The magnetic field generated by the current flowing in the conductive line may be inversely proportional to the distance from the conductive line, and may be proportional to the current flowing in the conductive line.

In addition, if the distance between the first metal lines 310-1, 310-2, 310-3, and 310-4 and the distance between the second metal lines 330-1, 330-2, 330-3, and 330-4 is long, the influence of the magnetic field generated by the metal lines other than the adjacent metal lines can be ignored in the region disposed between the adjacent two metal lines. Similarly, if the magnitude of the current flowing in each metal line is small, the influence of the magnetic field generated by the metal lines other than the adjacent metal lines can be ignored.

The metal lines defining the counter magnetic field generation region may be adjacent to the counter magnetic field generation region, and may refer to two first metal lines 310 and two second metal lines 330 surrounding the counter magnetic field generation region. In other words, the counter magnetic field generation region may refer to the region disposed between the metal lines. In addition, the unit pixels (PX) of the pixel array 110 may overlap with the counter magnetic field generation region.

For example, as shown in FIG. 6, the first counter magnetic field generation region CMA1 may be defined by the sum or difference of the induced magnetic field generated in the first metal line 310-1 receiving the first counter magnetic field generation current CMC1, the induced magnetic field generated in the first metal line 310-2 receiving the second counter magnetic field generation current CMC2, the induced magnetic field generated in the second metal line 330-1 receiving the fifth counter magnetic field generation current CMC5, and the induced magnetic field generated in the second metal line 330-2 receiving the sixth counter magnetic field generation current CMC6.

The counter magnetic field generated in each of the counter magnetic field generation regions CMA1 to CMA9 may be determined by the intensity and direction of each of the counter magnetic field generation currents CMC1 to CMC8 respectively applied to the first metal lines 310-1, 310-2, 310-3, and 310-4 and the second metal lines 330-1, 330-2, 330-3, and 330-4.

For example, as shown in FIG. 6, when the first counter magnetic field generation current CMC1 flows from the left side to the right side in the row direction of the pixel array 110, the direction of the magnetic field that is generated by the first counter magnetic field generation current CMC1 in the first counter magnetic field generation region CMA1 can be assumed to be the positive(+) direction for convenience of description.

When the second counter magnetic field generation current CMC2 flows in the same direction as the first counter magnetic field generation current CMC1, the direction of the magnetic field generated by the second counter magnetic field generation current CMC2 in the first counter magnetic field generation region CMA1 may be referred to as the negative(−) direction. This is because the direction of the induced magnetic field induced by the current flowing in the conductive line is based on Ampere's right-hand screw rule.

Similarly, when the fifth counter magnetic field generation current CMC5 flows from the upper side to the lower side in the column direction of the pixel array 110, the direction of the magnetic field generated by the fifth counter magnetic field generation current CMC5 shown in FIG. 6 in the first counter magnetic field generation region CMA1 may be set to the negative(−) direction according to Ampere's right-hand screw rule. When the sixth counter magnetic field generation current CMC6 flows in the opposite direction to the fifth counter magnetic field generation current CMC5, the direction of the magnetic field generated by the sixth counter magnetic field generation current CMC6 in the first counter magnetic field generation region CMA1 may be set to the negative(−) direction.

The counter magnetic field generated in the first counter magnetic field generation region CMA1 may be modified depending on the distance from the center of the first counter magnetic field generation region CMA1 to each of the first metal lines 310-1 and 310-2 defining the first counter magnetic field generation region CMA1 and the distance from the center of the first counter magnetic field generation region CMA1 to each of the second metal lines 330-1 and 330-2 defining the first counter magnetic field generation region CMA1

When the distance W1 in the column direction between the adjacent first metal lines (e.g., 310-1 and 310-2) is constant, the intensity of the counter magnetic field applied to the center point of the counter magnetic field generation regions CMA1 to CMA9 by the first metal lines 310-1, 310-2, 310-3, and 310-4 may be inversely proportional to the distance W1 in the column direction between the first metal lines 310-1, 310-2, 310-3, and 310-4.

Similarly, when the distance W2 in the row direction between the adjacent second metal lines (e.g., 330-1 and 330-2) is constant, the intensity of the counter magnetic field applied to the center point of the counter magnetic field generation regions CMA1 to CMA9 by the second metal lines 330-1, 330-2, 330-3, and 330-4 may be inversely proportional to the distance W2 in the row direction between the second metal lines 330-1, 330-2, 330-3, and 330-4.

With respect to the first counter magnetic field generation region CMA1, if the counter magnetic field generated by the first counter magnetic field generation current CMC1, the second counter magnetic field generation current CMC2, the fifth counter magnetic field generation current CMC5, and the sixth counter magnetic field generation current CMC6 is referred to as the first counter magnetic field B1, and the length L1 of each of the first metal lines 310-1, 310-2, 310-3, and 310-4 and the length L2 of each of the second metal lines 330-1, 330-2, 330-3, and 330-4 are sufficiently long, the first counter magnetic field B1 may be represented by the following equation 4.

$$B1 = \left(\frac{CMC1}{W1} - \frac{CMC2}{W1} - \frac{CMC5}{W2} - \frac{CMC6}{W2}\right) * k * 2 \quad \text{(Eq. 4)}$$

Here, $k=2*10^{\wedge}(-7)$ and the unit of the value of k may be denoted by (T*m/A). The unit of the counter magnetic field generation current (e.g., CMC1) may be ampere (A), and the unit of the distance (e.g., W1 or W2) in the column direction or row direction between the metal lines may be meter (m).

Similarly, in association with the second counter magnetic field generation region CMA2, if the generated counter magnetic field is referred to as the second counter magnetic field B2, the second counter magnetic field B2 may be represented by the following equation 5.

$$B2 = \left(\frac{CMC2}{W1} + \frac{CMC3}{W1} - \frac{CMC5}{W2} - \frac{CMC6}{W2}\right) * k * 2 \quad \text{(Eq. 5)}$$

In addition, in association with the third counter magnetic field generation region CMA3, if the generated counter magnetic field is referred to as the third counter magnetic field B3, the third counter magnetic field B3 may be represented by the following equation 6.

$$B3 = \left(-\frac{CMC3}{W1} + \frac{CMC4}{W1} - \frac{CMC5}{W2} - \frac{CMC6}{W2}\right) * k * 2 \quad \text{(Eq. 6)}$$

The shielding device 180 may adjust the counter magnetic field generation currents CMC1 to CMC8, such that the shielding device 180 can offset the induced magnetic field generated in the second substrate 400 in units of a predetermined region of the pixel array 110.

Figure 7:
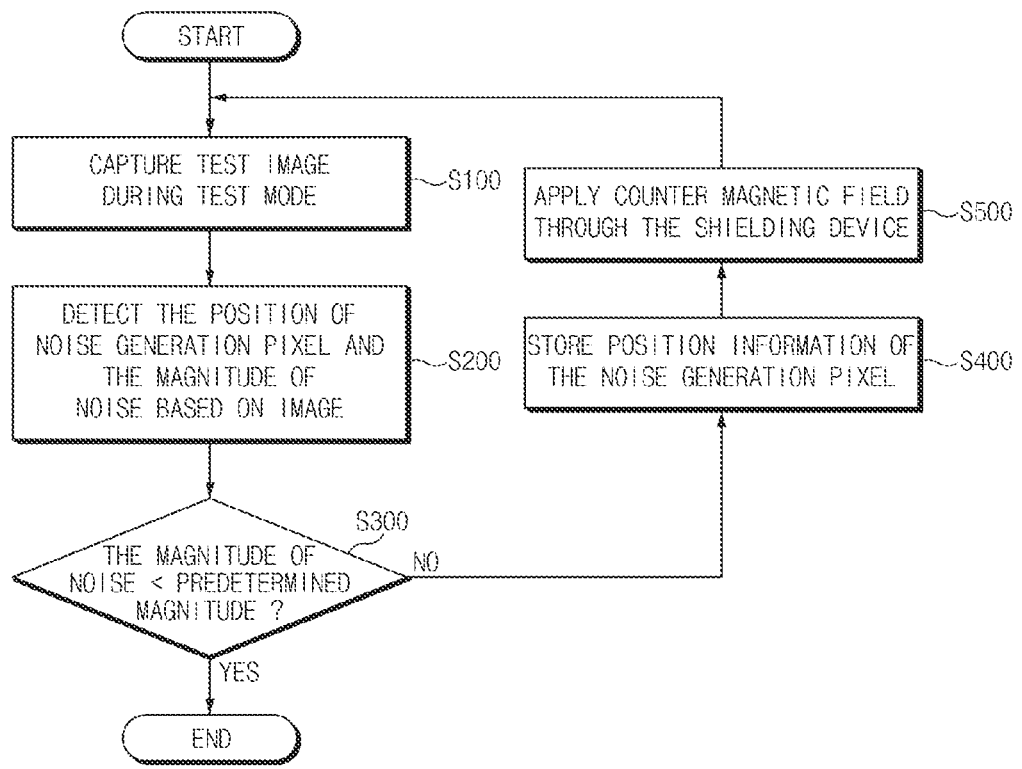
FIG. 7 is a flowchart illustrating an example of a method for reducing noise of the image sensing device based on some implementations of the disclosed technology.

FIG. 7 is a flowchart illustrating an example of a method for reducing noise of the image sensing device 100 based on some implementations of the disclosed technology.

FIG. 7 exemplarily illustrates a method for detecting noise of the image sensing device and a method for reducing noise of the image sensing device.

Referring to FIG. 7, the image sensing device 100 may capture a test image during a test mode (S100). In more detail, the first substrate 200 included in the image sensing device 100 may receive incident light emitted by the test image in the pixel array 110, such that the first substrate 200 may output a pixel signal (e.g., a reference signal and an image signal).

The pixel signal may be an analog signal. The image sensing device 100 may convert the analog signal into a digital signal.

The analog signal may be converted into the digital signal in the second substrate 400 included in the image sensing device 100. The image sensing device 100 may acquire image data using the converted digital signal.

The shielding controller included in the image sensing device 100 may analyze the acquired image data, such that the shielding controller can acquire not only the magnitude of noise caused by the induced electromagnetic field generated in the second substrate 400, but also information about the position of a noise generation pixel (S200).

Referring to FIG. 7, the method for acquiring the magnitude of noise and the position information of the noise generation pixel by analyzing image data has already been disclosed in FIG. 2, and as such a detailed description thereof will herein be omitted for convenience of description.

As described above, the electromagnetic field may be induced in the second substrate 400 and thus may affect the first substrate 200.

In some implementations, the electromagnetic field induced by the electrical signal applied to the logic region of the second substrate 400 generates the induced current in the conductor loop formed in the first substrate 200, causing noise that can affect the pixel signal.

For example, the shielding controller may compare the magnitude of the image signal detected in the test mode with a predetermined value to acquire the magnitude of noise (e.g., noise that is caused by the induced electromagnetic field) and the location of noise sources such as the address of the pixels where the noise has occurred. In some implementations, the shielding controller may compare the magnitudes of the image signals detected in the adjacent unit pixels (PX) with each other to determine the magnitude of noise and the location of noise sources such as the address of the pixels with noise.

In some implementations, the shielding controller may compare the image data segments captured by the image sensing device 100 with each other on a frame-by-frame basis to determine the magnitude of noise and the location of noise sources such as the address of the pixels with noise.

The shielding controller may determine whether the magnitude of noise caused by the induced electromagnetic field detected from the image data is less than a predetermined magnitude (S300).

If the magnitude of noise caused by the induced electromagnetic field is less than a predetermined magnitude, the shielding controller may determine that distortion of image data caused by the induced electromagnetic field is not severe, and thus the shielding controller does not provide the counter electromagnetic field generation signal to the shielding layer 300.

If the magnitude of noise caused by the induced electromagnetic field is equal to or greater than a predetermined magnitude, the shielding controller may store the address of the unit pixel (PX) with noise in which the pixel signal is distorted by the induced electromagnetic field (S400).

The shielding controller may store the address of the unit pixel (PX) having a distorted pixel signal from among the plurality of unit pixels (PX) disposed in the pixel array 110. In addition, the shielding controller may transmit a control signal to the shielding device 180 in a manner that the shielding device 180 can output the counter electromagnetic fields for offsetting the induced electromagnetic field affecting the corresponding unit pixel (PX).

The shielding device 180 having received the control signal may output the counter electromagnetic fields for offsetting the influence of the induced electromagnetic field on the first substrate 200 (S500).

The shielding driver included in the shielding device 180 may decode the control signal received from the shielding controller. The shielding driver may adjust the counter magnetic field generation current applied to the metal lines connected to the shielding driver.

The shielding device 180 may adjust the magnitude and direction of the counter magnetic field generation current applied to the metal lines, such that the induced electromagnetic fields generated in the second substrate 400 can be offset. Specifically, the shielding device 180 may selectively offset the induced electromagnetic field that affects the unit pixels (PX) disposed at any position of the pixel array 110.

The shielding device 180 may offset the induced electromagnetic field of the second substrate 400 affecting the first substrate 200, thereby actively removing noise generated in the pixel signal by the induced electromagnetic field.

In some other implementations, the shielding device 180 may include two types of metal lines orthogonal to each other. Here, the shielding device 180 may include a plurality of shielding drivers extending in directions orthogonal to each other.

The shielding controller may provide the control signal to the shielding drivers extending in the directions orthogonal to each other.

The image sensing device 100 may offset the induced electromagnetic field using the shielding device 180 and perform operations in the test mode.

The image sensing device 100 may capture images in the test mode to acquire image data that is less affected by the induced electromagnetic field.

The shielding controller may store information about the magnitude of the counter electromagnetic fields for offsetting the influence of the induced electromagnetic field, and may store information about where and how much to apply the counter electromagnetic fields. The information about the counter electromagnetic fields may include a control signal for the counter magnetic field generation current (CMC).

When the shielding controller captures images based on the information about the location of the pixels with noise, the magnitude of the noise, and where to apply the counter electromagnetic fields acquired through the test mode, the shielding controller can apply the counter electromagnetic fields through the shielding device 180 while capturing images.

Since the shielding device 180 based on some implementations of the disclosed technology can apply the counter electromagnetic fields, the noise that would have resulted from the electromagnetic field induced in the second substrate 400 can be reduced or removed during an image capturing operation.

In some implementations, the image capturing operation includes an image capturing mode, a phase-difference detection mode, and other modes that convert light into electrical signals.

In some other implementations, the shielding controller may detect the address or location of the pixel with noise and the magnitude of noise during the image capturing operation. The shielding controller may compare the image data segments captured within a predetermined time with each other on a frame-by-frame basis, to detect how much noise affects the image sensing device 100 at each point in time.

The shielding controller may output the control signal for the shielding device 180 to offset the influence of detected noise, thereby reducing or removing the noise from image data that would have resulted from electromagnetic fields induced in the second substrate 400

As is apparent from the above description, the image sensing device based on some implementations of the disclosed technology can offset electromagnetic fields generated in a substrate using a shielding device, thereby reducing or removing noise from image data and improving the image quality.

Although a number of illustrative embodiments have been described, it should be understood that variations and modifications of the disclosed embodiments and other embodiments can be devised based on what is described and/or illustrated in this patent document.

What is claimed is:

1. An image sensing device comprising:
   a first substrate structured to support a pixel array that includes a plurality of unit pixels arranged in a first direction and a second direction and detecting incident light to produce pixel signals carrying image information in the incident light;
   a second substrate structured to support one or more circuits for operations of the image sensing device including receiving a pixel signal from the plurality of unit pixels; and
   a shielding layer disposed between the first substrate and the second substrate,
   wherein the shielding layer includes shielding driver circuitry and conductive lines coupled to the shielding driver circuitry to receive electrical currents which produce electromagnetic fields to offset electromagnetic fields induced by currents in the one or more circuits supported by the second substrate.

2. The image sensing device according to claim 1, wherein:
   the conductive lines in the shielding layer includes a plurality of first metal lines extending in the first direction;
   the shielding driver circuitry applies a current to at least one of the plurality of first metal lines; and the plurality of unit pixels is arranged to overlap with a region between the first metal lines adjacent to each other.

3. The image sensing device according to claim 2, wherein the shielding layer includes:
a plurality of second metal lines extending in the second direction; and
the shielding driver circuitry is further coupled to apply a current to at least one of the plurality of second metal lines.

4. The image sensing device according to claim 3, wherein:
the plurality of unit pixels is arranged to overlap with a region between the first metal lines that are adjacent to each other and the second metal lines that are adjacent to each other.

5. The image sensing device according to claim 3, wherein:
the second metal lines are spaced apart from each other at intervals of a second distance,
wherein the second distance is longer than a distance between columns of the pixel array.

6. The image sensing device according to claim 2, wherein:
the first metal lines are spaced apart from each other at intervals of a first distance,
wherein the first distance is longer than a distance between rows of the pixel array.

7. The image sensing device according to claim 1, wherein:
the one or more circuits supported by the second substrate include at least one of a row driver, a correlated double sampler (CDS), an analog-digital converter (ADC), an output buffer, a column driver, and a timing controller.

8. The image sensing device according to claim 1, wherein:
the pixel array includes at least one of a reset transistor, a transfer transistor, a drive transistor, and a selection transistor.

9. An image sensing device comprising:
a first substrate including a plurality of image sensing pixels arranged in a pixel array to generate pixel signals by converting incident light;
a second substrate including circuitry generating image data based on the pixel signals from the pixel array;
a shielding layer disposed between the first substrate and the second substrate and structured to include metal lines and shielding driver circuitry coupled to supply currents to the metal lines; and
a shielding controller determining an address of a pixel that generates a pixel signal including noise and a level of the noise in the pixel signal based on the image data and provide a control signal to the shielding layer to generate a counter electromagnetic field that has a polarity opposite to electromagnetic fields that creates the noise,
wherein the shielding driver circuitry generates the counter electromagnetic field through a current provided to at least one metal lines based on the control signal.

10. The image sensing device according to claim 9, wherein:
if the level of the noise is equal to or greater than a predetermined value, the shielding controller outputs the control signal.

11. The image sensing device according to claim 9, wherein:
the shielding controller outputs the control signal for offsetting the noise for each row in the pixel array.

12. The image sensing device according to claim 9, wherein the metal lines in the shielding layer include:
a plurality of first metal lines extending in a row direction of the pixel array;
a plurality of second metal lines extending in a column direction of the pixel array, and
wherein the shielding driver circuitry is coupled to generate the counter electromagnetic field through at least one of the plurality of second metal lines based on the control signal.

13. The image sensing device according to claim 12, wherein:
the shielding controller outputs the control signal for offsetting the noise for each unit pixel included in the pixel array.

14. The image sensing device according to claim 12, wherein:
the pixel array is arranged to overlap with the first metal lines and the second metal lines.

15. The image sensing device according to claim 9, wherein:
the pixel array is arranged to overlap with the metal lines.

16. An image sensing device comprising:
a pixel array region structured to include a plurality of image sensing pixels arranged in rows and columns to produce pixel signals by converting incident light;
a circuit region structured to include circuitry to process the pixel signal produced by the plurality of image sensing pixels; and
a shielding layer disposed between the pixel array region and the circuit region and including a plurality of shielding metal lines coupled to a decoder selecting one or more of the plurality of shielding metal lines to provide a current to selected shielding metal lines to generate counter electromagnetic fields,
wherein the counter electromagnetic fields have a polarity opposite to electromagnetic fields that are induced in the pixel array region.

17. The image sensing device according to claim 16, wherein the plurality of shielding metal lines is arranged in rows and columns, and the decoder includes a row decoder and a column decoder.

18. The image sensing device according to claim 16, wherein the decoder selects the one or more of the plurality of shielding metal lines to provide the current by comparing the pixel signals to a threshold value for determining whether to apply the counter electromagnetic fields.

* * * * *